United States Patent

Westlund

Patent Number: 5,949,176
Date of Patent: Sep. 7, 1999

[54] ELECTRON HEAT CONVERTER

[76] Inventor: Fred G. Westlund, P.O. Box 5448, Pine Mountain Club, Calif. 93222

[21] Appl. No.: 08/831,215

[22] Filed: Apr. 2, 1997

[51] Int. Cl.[6] .................................................. H02N 10/00
[52] U.S. Cl. .......................... 310/306; 310/309; 136/201; 136/205; 136/223
[58] Field of Search .................................. 136/200, 201, 136/205, 223; 310/306, 308, 309

[56] References Cited

U.S. PATENT DOCUMENTS

| | | | |
|---|---|---|---|
| 3,188,539 | 6/1965 | Oxley | 317/248 |
| 3,214,656 | 10/1965 | Caron | 317/248 |
| 3,515,908 | 6/1970 | Caldwell | 310/4 |
| 4,004,210 | 1/1977 | Yater | 322/2 R |
| 4,281,280 | 7/1981 | Richards | 322/2 R |
| 4,686,847 | 8/1987 | Besocke | 73/23 |
| 4,920,450 | 4/1990 | Masiulis | 361/282 |
| 5,288,336 | 2/1994 | Strachan et al. | 136/200 |
| 5,637,946 | 6/1997 | Bushman | 310/306 |

*Primary Examiner*—Kathryn Gorgos
*Assistant Examiner*—Thomas H. Parsons
*Attorney, Agent, or Firm*—Merchant & Gould

[57] ABSTRACT

A device that utilizes the difference in NEAF values between two plates to generate voltage is disclosed. The difference in NEAF values is created by shaping or varying the thickness of two plates to create a voltage differential which is available to drive electrical devices.

22 Claims, 7 Drawing Sheets

ELECTRON HEAT CONVERTER

CROSS-REFERENCE TO RELATED APPLICATIONS

This application is related to U.S. patent application Ser. No. 08/755,323, entitled "BIMETALLIC HEAT CONVERTER," filed on Nov. 22, 1996, by Fred G. Westlund, which is hereby incorporated by reference.

BACKGROUND OF THE INVENTION

1. Field of the Invention.

This invention relates in general to an electronic device, and more particularly, to a device that converts constant temperature ambient heat into electrical energy.

2. Description of Related Art

Devices that convert heat into electricity are usually used as thermocouples. Thermocouples are usually used to measure temperature at remote locations, and require two different temperatures to operate.

However, the electrical properties of the thermocouple materials, typically iron and constantan, are used mainly to measure a difference in temperature, and not for the conversion of constant temperature ambient heat (CTAH) into electricity for electrical power output. Further, thermocouples require two different kinds of material to generate voltage. It can be seen that there is a need for a device that can convert constant temperature ambient heat into electricity. It can also be seen that there is a need to transfer electrons or electricity generated by this converter for electrical power output. It can also be seen that there is a need to generate voltage from a single type of material.

SUMMARY OF THE INVENTION

To minimize the limitations in the prior art described above, and to minimize other limitations that will become apparent upon reading and understanding the present specification, the present invention discloses a powerful and highly productive apparatus and method for converting constant temperature ambient heat into electricity.

The present invention solves the above-described problems by equalizing the voltage of the surface charge electrons on the plates by changing the shape or thickness of two plates such that the difference in the shape or thickness of the materials generates a difference in their free electron voltage.

A device made in accordance with the principles of the present invention comprises two plates, each with their own NEAF value and both made of a single type of material, and a second material coupled between and fixedly separating the first and second charge plates, wherein the second material allows a flow of surface charge electrons between the first charge plate and the second charge plate and restricts a flow of free electrons between the first plate and the second plate.

One aspect of the present invention is to convert constant temperature ambient heat into electrical energy. Another aspect of the present invention is to transfer electrical energy. Still another aspect of the present invention is to generate electrical energy from constant temperature ambient heat.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there is illustrated and described specific examples of an apparatus in accordance with the invention.

BRIEF DESCRIPTION OF THE DRAWINGS

Referring now to the drawings in which like reference numbers represent corresponding parts throughout.

DETAILED DESCRIPTION OF THE INVENTION

In the following description of the preferred embodiment, reference is made to the accompanying drawings which form a part hereof, and in which is shown by way of illustration the specific embodiment in which the invention may be practiced. It is to be understood that other embodiments may be utilized as structural changes may be made without departing from the scope of the present invention.

The present invention provides an apparatus and method for transferring and generating electrical energy from constant temperature ambient heat (CTAH). This is done through the use of different material properties and proper alignment of these material properties to perform the conversion, generation, and transfer functions of the invention.

Figure 1A:
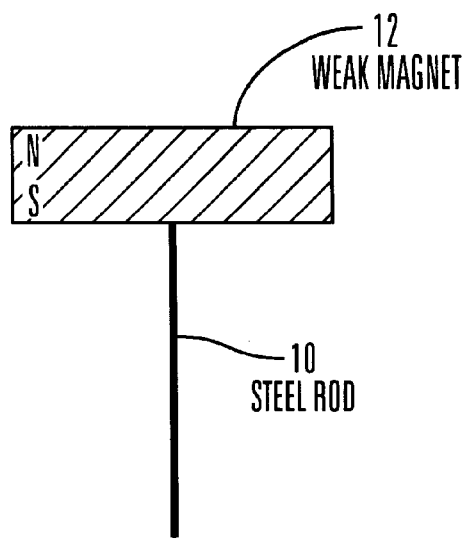
FIGS. 1A–1C are drawings of magnets holding steel rods.
Figure 1B:
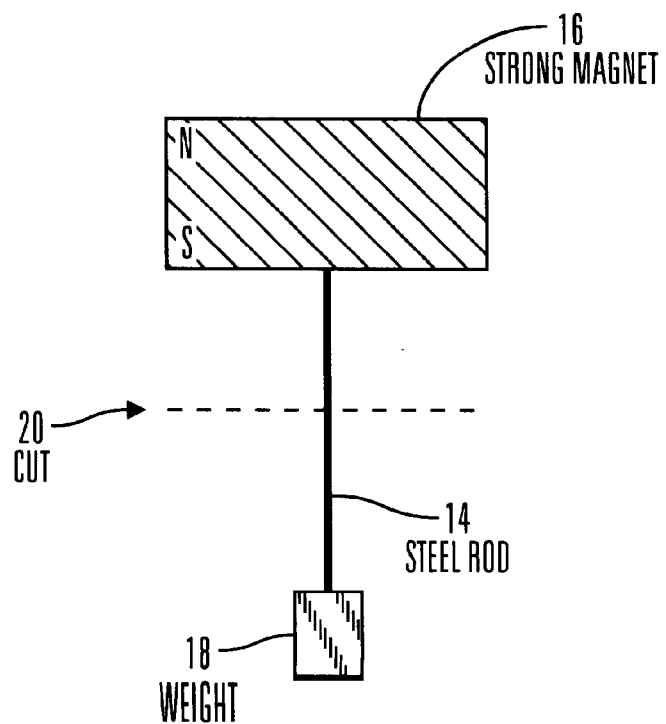
Figure 1C:
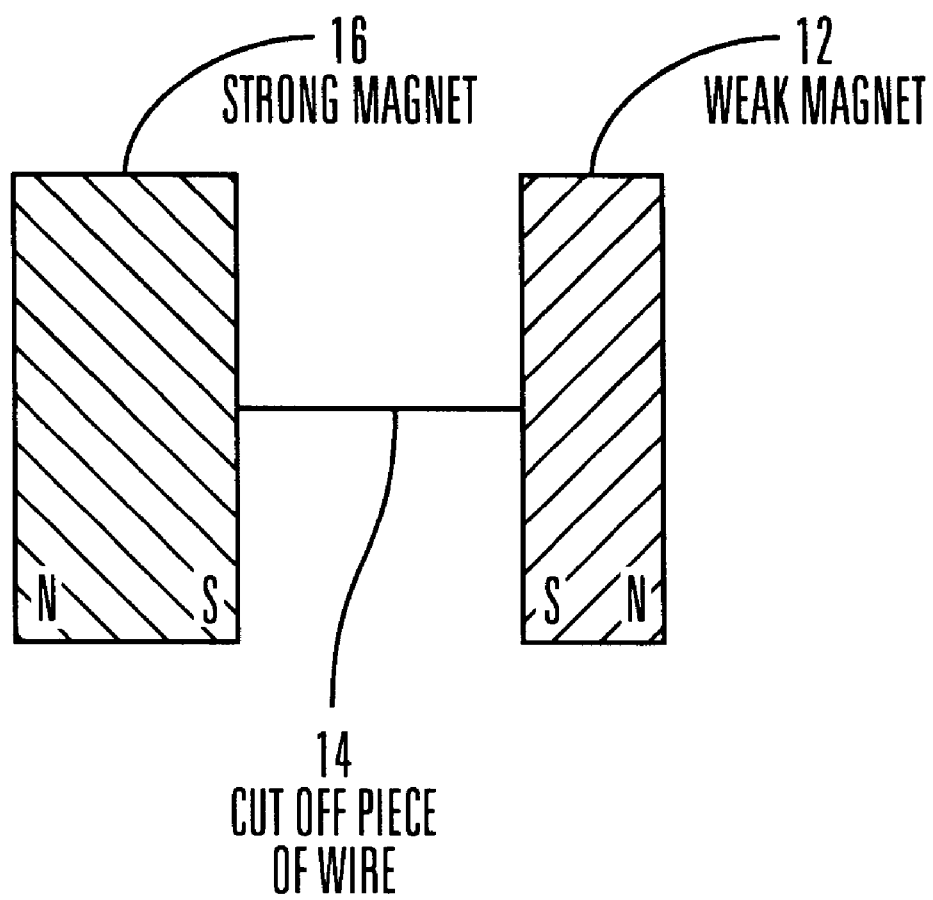

FIGS. 1A–1C are drawings of magnets holding steel rods.

FIG. 1A shows a long steel rod 10 and a weak magnet 12. The length of the steel rod 10 has been adjusted so that the magnet 12 will be supported by the strength of its magnetic field. A very slight pull will cause the rod 10 to fall. Thus, the inward pull between the magnet 12 and the rod 10 due to the magnetic field strength of the magnet 12 is equal to the weight of the rod.

FIG. 1B illustrates a short steel rod 14 with a strong magnet 16. A non-magnetic weight 18 has been added to the steel rod 14 so that the weight of steel rod 14 and weight 18 are equal to the weight of rod 10. Thus, the inward pull between the magnet 16 and the rod 10 is equal to the combined weight of the steel rod 14 and the non-magnetic weight 18. The attraction force between the short steel rod 14 and the magnet 16 is sufficient to support the weight of the steel rod 14 and the added weight 18. A cut 20 is shown to indicate where the rod 14 will be cut in FIG. 1C.

A long steel rod 10 and a weak magnet 12 will develop the same inward attraction force as a short steel rod 14 and a strong magnet 16. The illustration of FIGS. 1A and 1B are analogous to the relationship between the nucleaic attraction forces (NEAF) and the surface charge electrons (SCEs). Surface charge electrons are defined to be the electrons on the surface and the area surrounding a metal. Some of the surface charge electrons are within the lattice work structure of the metal as well. Free electrons are defined as the electrons on the surface of the molecules within the lattice work of the metal. A short column of SCEs extending a short distance from the surface of a metal with a strong NEAF will have the same inward force as a long column of SCEs extending a long distance from the surface of a metal with a weak NEAF. The SCEs then exert an inward force exerted on the free electrons (FEs) to change the voltage of the FEs.

FIG. 1C illustrates rod 14 had been cut at cut 20 and then placed between magnets 12 and 16. The forces on the rod 14 then reach equilibrium, where the equipotential line between the two magnets 12 and 16 is closer to the weaker magnet 12. The inward pull between the steel rod 14 and the stronger magnet 16 is stronger than the pull between the steel rod 14 and the weaker magnet 12. The inward pull of the rod 14 toward either magnet 12 or 16 is reduced by the attraction from the opposing magnet 12 or 16.

The forces on the rod 14 are analogous to the pull of the SCEs between a plate with a weak NEAF and a strong NEAF.

Figure 2A:
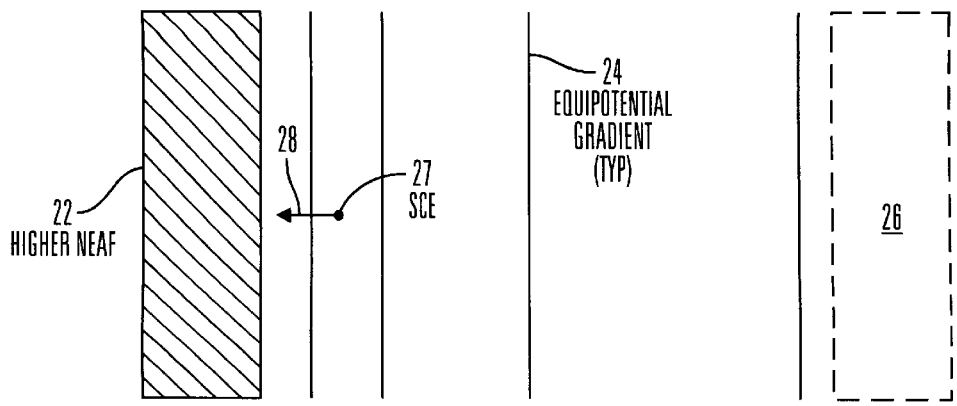
FIGS. 2A–2C illustrate the equipotential gradients and forces on surface charge electrons created by two plates.
Figure 2B:
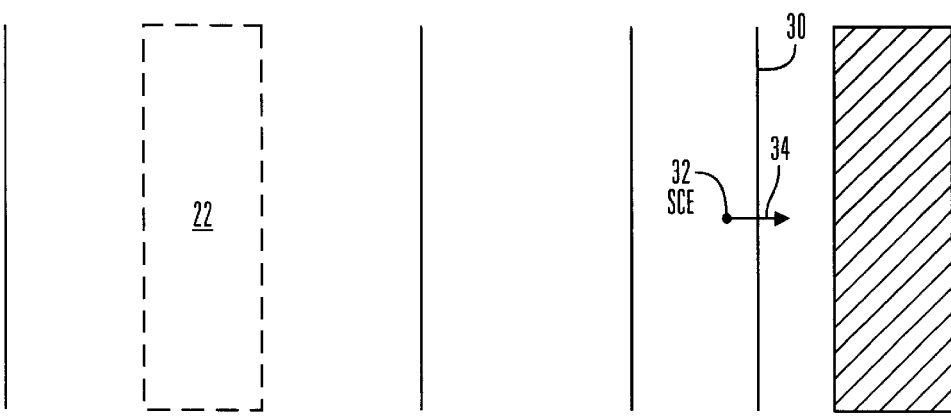
Figure 2C:
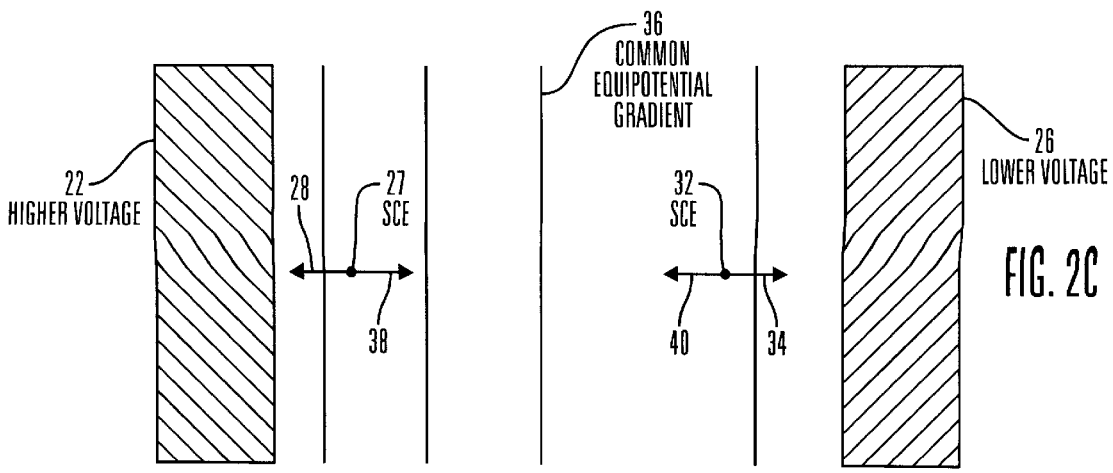

FIGS. 2A–2C illustrate the equipotential gradients and forces on surface charge electrons created by two plates.

FIG. 2A shows a first plate 22 and the equipotential gradients 24 created by the NEAF of first plate 22. The equipotential gradients 24 are shown as if second plate 26, shown in phantom lines, is not present. First plate 22 has a higher NEAF than plate 26. The first plate 22 will thus have fewer SCEs, and the SCEs of first plate will thus be closer together. A typical SCE 27 with force 28 is shown. Force 28 is inward towards plate 22 because of the NEAF of plate 22.

The two metal plates 22 and 26 have equal FE voltages, but the NEAFs are different. This is possible in various metals, or within the same metal, or between two different compounds, due to temperature, lattice geometry, lattice constant, or other properties of the materials being used or plates 22 and 26. For example, above 65° F., the NEAF in iron is stronger than the NEAF in constantan.

FIG. 2B illustrates plate 26 and the equipotential gradients 30 generated by plate 26 due to the NEAF of plate 26. Plate 22 is now shown in phantom. The equipotential gradients 30 of plate 26 are shown as if plate 22 was not present. Since plate 26 has a lower NEAF than plate 22, the equipotential gradients 30 are farther away from plate 26 than equipotential gradients 24 are from plate 22. For example, first equipotential gradient 30 may be several centimeters away from plate 26, while the corresponding equipotential gradient 24 may only be a few millimeters away from plate 22. Plate 26 thus attracts more SCEs which are further apart than the SCEs for plate 22, due to the lower NEAF of plate 26. A typical SCE 32 with force 34 is shown. SCE 32 is shown at the same distance from plate 26 as SCE 27 is from plate 22.

FIG. 2C illustrates both plates 22 and 26 as they are placed in close proximity. The number of SCEs attracted to each plate 22 and 26 is reduced because the NEAF of plates 22 and 26 will cancel in the areas not between plates 22 and 26. Plate 22 will block more of the NEAF of plate 26 than plate 26 will block of plate 22.

As plates 22 and 26 are brought within close proximity, the equipotential gradients 24 and 30 will be superimposed, and combine to create a common equipotential gradient 36. This gradient 36 will not be centered between plates 22 and 26, but will be shifted towards plate 26, because the NEAF of plate 22 is greater than the NEAF of plate 26.

Once this superimposition takes place, the NEAF of both plates 22 and 26 must be accounted for on the SCEs 27 and 32. To show the additional forces on SCEs 27 and 32, force 38 is shown as pulling SCE 27 away from plate 22 and force 40 is shown as pulling SCE 32 away from plate 26. The higher NEAF of plate 22 exerts a greater pull on SCE 32 than the lower NEAF of plate 26 exerts on SCE 27, thus the imbalance of the NEAFs in plates 22 and 26 makes force 40 greater than force 38. SCE 27 will move away from plate 22, but not as much as SCE 32 will move away from plate 26.

The total force exerted on the FEs in plate 22 is the sum of the inward force of the SCEs, opposite a given area, between plate 22 and the common equipotential gradient 36 plus the pressure of the common equipotential gradient 36. The same is true for the total pressure exerted on plate 26. Since there are more SCEs between the common equipotential gradient 36 and plate 22 and the inward pull is stronger, the voltage of the FEs in plate 22 will be raised compared to the FEs voltage in plate 26. At equilibrium, the FEs voltage in plate 26 (lower NEAF) will always be lower than the FEs voltage in plate 22 (higher NEAF).

Figure 3A:
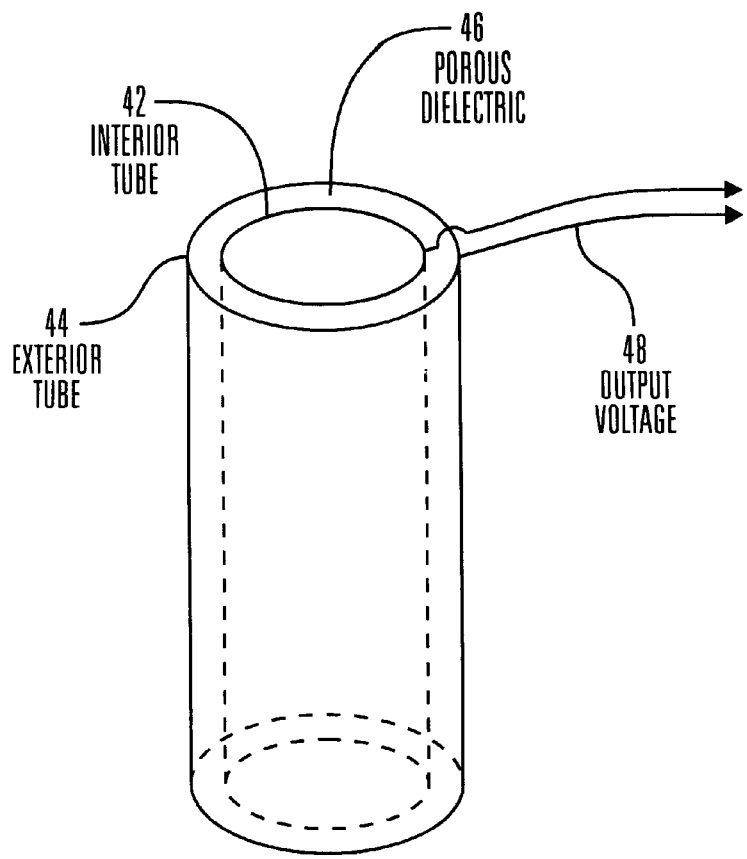
FIGS. 3A–3B illustrate two possible embodiments of the present invention.
Figure 3B:
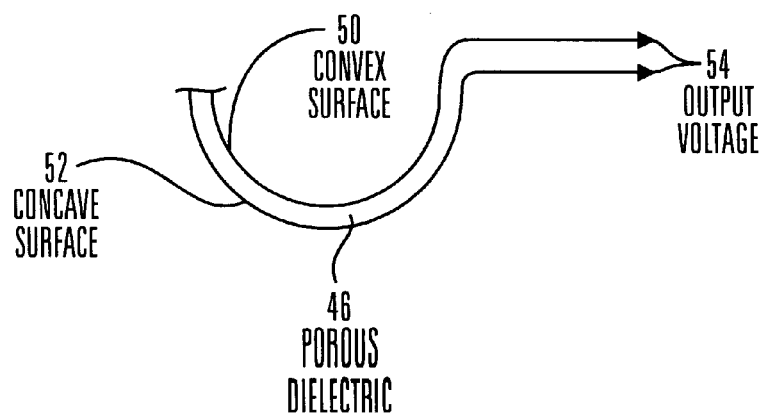

FIGS. 3A–3B illustrate two possible embodiments of the present invention.

FIG. 3A shows an interior tube 42, an exterior tube 44, and a porous dielectric 46 disposed between interior tube 42 and exterior tube 44. If the same material is used to form interior tube 42 and exterior tube 44, the interior tube 42 will have a lower NEAF, because the smaller surface area of the convex surface of interior tube 42 will support fewer SCEs than the larger, concave surface area of exterior tube 44. Thus, there will be an output voltage 48 between interior tube 42 and exterior tube 44, because the imbalance of the NEAFs will create different voltages on the FEs within the material used to make the tubes 42 and 44. The porous dielectric 46 facilitates the movement and presence of SCEs between the tubes 42 and 44.

FIG. 3B illustrates a convex surface 50, a concave surface 52, and a porous dielectric 46 disposed between convex surface 50 and concave surface 52. Concave surface 52 and convex surface 50 can take many shapes, e.g., square corners, points, surfaces of unequal radii, and surfaces that are not continuously equidistant from each other. If the same material is used to form convex surface 50 and concave surface 52, convex surface 50 will have a lower NEAF, because the smaller surface area of convex surface 50 will support fewer SCEs than the larger area of concave surface 52. Thus, there will be an output voltage 54 between convex surface 50 and concave surface 52, because the imbalance of the NEAFs will create different voltages on the FEs within the material used to make the surfaces 50 and 52. The porous dielectric 46 facilitates the movement and presence of SCEs between the surfaces 50 and 52.

The porous dielectric 46 allows for conduction of surface charge electrons and constrained conduction of free electrons. Porous dielectric 46 has a much lower NEAF than tubes 42 and 44, plates 22 and 26, and surfaces 50 and 52. Typical materials that could be used are porous dielectrics 46, defined as a dielectric material with holes, such as a nylon cloth. The spaces between the threads and the spaces between the fibers allow surface charge electrons to flow through the porous dielectric 46. A porous dielectric will allow the flow of surface charge electrons but will prevent or reduce the flow of free electrons as defined above. Porous dielectrics may also consist of gases or a vacuum, or such substances as mineral oil.

The NEAF can also be modified by changing the thickness of the material used to make interior tube 42 and exterior tube 44, or alternatively convex surface 50 and concave surface 52. By reducing the thickness, the NEAF is lessened because there are fewer nuclei to support the equipotential gradients.

Figure 4:
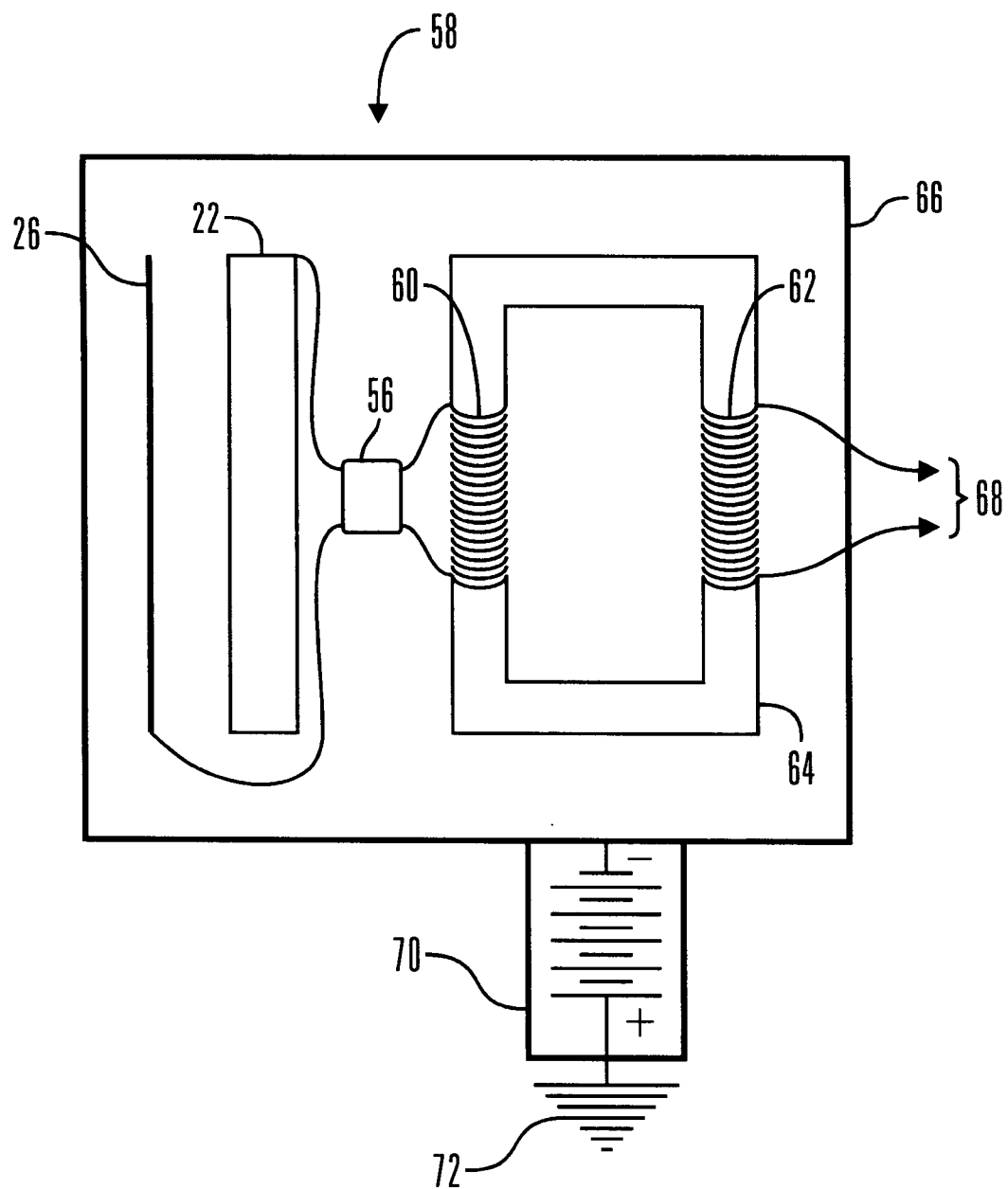
FIG. 4 illustrates a device that increases the charge on the plates of the present invention.

FIG. 4 illustrates a device that increases the charge on the plates of the present invention.

Plate 22 and plate 26 are connected to switch 56. Switch 56 can be a four way automatic reversing switch, or a simple on/off switch, depending on the type of output wave desired from device 58. Switch 56 is coupled to primary coil 60, which is coupled to secondary coil 62 via transformer core 64. The plates 22 and 26, switch 56, coils 60 and 62, and core 64 are encased in dielectric case 66. Dielectric case 66 serves to isolate the charges on plates 22 and 26 from outside interference of other charges and increase the surface charges within dielectric case 66. Leads 68 emerge from dielectric case 66 to provide electrical energy to an external device. Transformer core 64 and coils 60 and 62 serve to step up or step down the voltage across leads 68, and to isolate the power developed by plates 22 and 26 from charges outside the dielectric case 66 and interferences from outside of the dielectric case 66.

Battery 70 has the positive terminal connected to ground 72, and the negative terminal connected to dielectric case 66. This connection will charge the dielectric case 66 with additional surface charge electrons, which in turn charges the device 58 such that additional charges will flow in the plates 22 and 26, and thus in the output leads 68. Further, the polarity of battery 70 can be reversed such that the flow of electrons may be reversed in leads 68.

Figure 5:
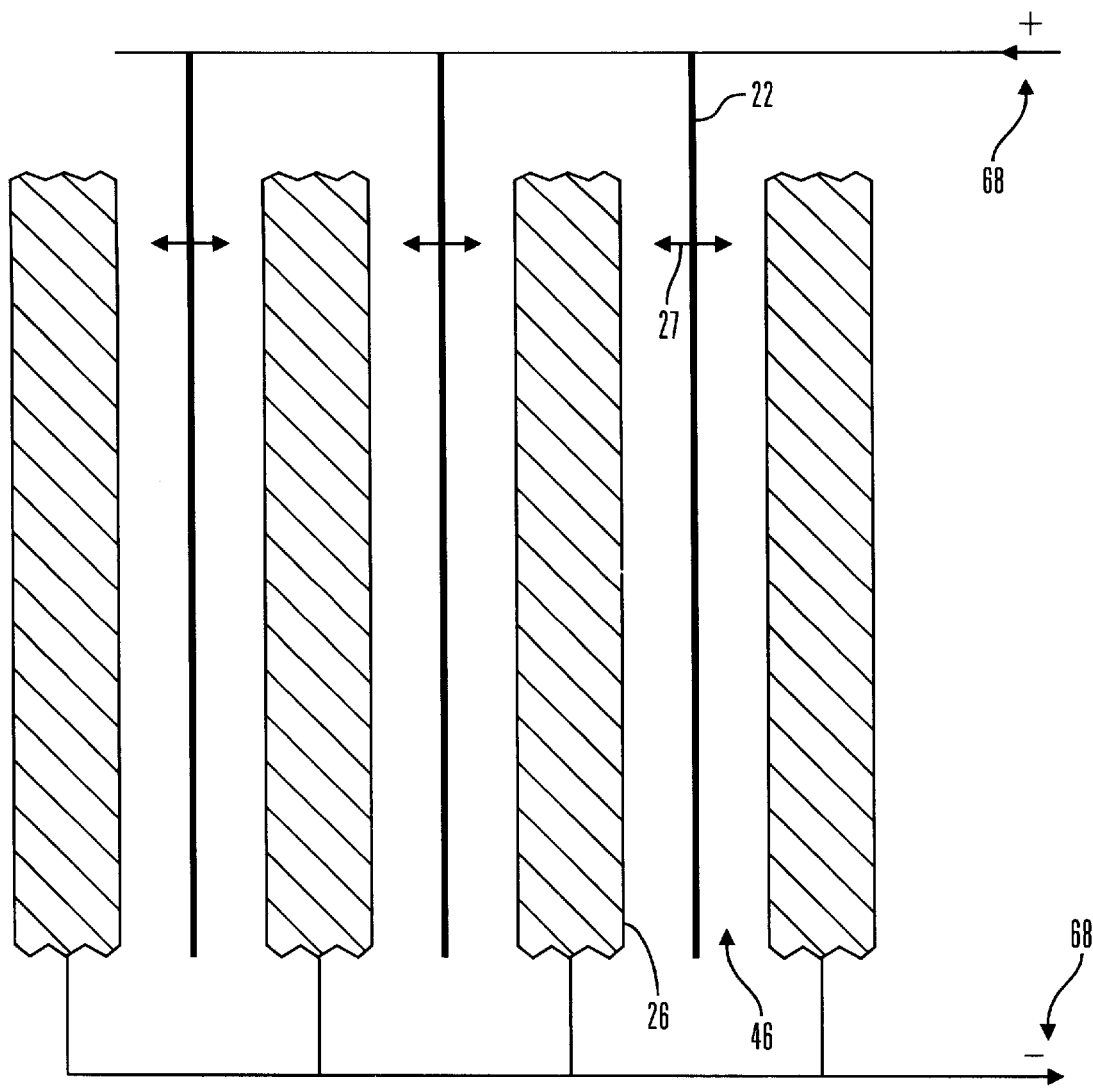
FIG. 5 illustrates one possible embodiment of the present invention.

FIG. 5 illustrates one possible embodiment of the present invention. Plates 22 and 26 are placed such that each plate 22 is surrounded by one or more plates 26. Plates 22 and 26 can have various thicknesses, widths, or shapes; the straight plates shown in FIG. 5 are shown only for purposes of ease of illustration. For example, plates 22 may have a thickness of 5 mils and a width of 10 mils, while plates 26 have a thickness of one inch and a width of four inches. The geometry of plates 22 and 26 can be varied in any dimension without departing from the present invention. SCE 27 is shown to show that the electron flow is away from plate 22.

Figure 6:
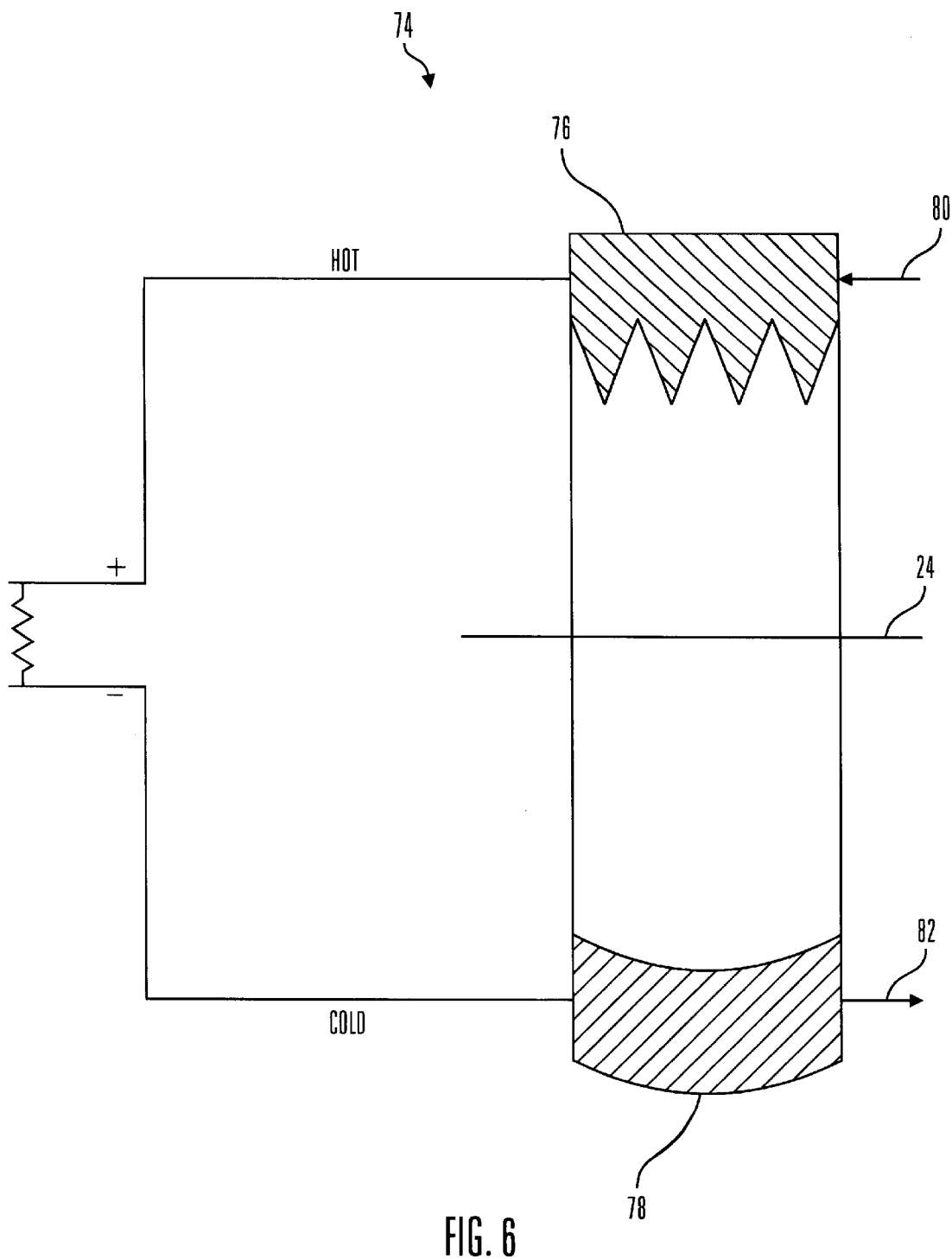
FIG. 6 shows a co-generator utilizing the present invention.

FIG. 6 shows a co-generator utilizing the present invention.

Co-generator 74 contains hot plate 76 and cold plate 78. By applying heat 80 and or cold 82 at the plates 76 and 78, electricity is generated. By changing the NEAFs of the plates 76 and 78 as described in the present invention, electricity will be generated without the input of heat 80, as well as becoming more efficient with the application of heat 80. Adding heat 80 to one or both of the plates 76 and 78 will increase the difference of the NEAF values of plates 76 and 78.

Cold plate 78 can take any shape, such as a large disk, or possibly a hemisphere where the concave part of the hemisphere faces hot plate 76. Hot plate 76 can take any shape as well, such as the jagged edged plate shown. The use of various materials, distances between the plates 76 and 78, and shapes, widths, and thicknesses of the materials used to manufacture plates 76 and 78, the equipotential line 24 can be placed anywhere desired between plates 76 and 78 or outside plates 76 and 78. This will create a co-generator that will generate electricity without the input of heat 80; instead, electricity will be generated at room temperature or from large sources of constant temperature ambient heat, such as oceans or underground rooms.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. An electrical device for converting ambient heat into electrical energy, comprising:
    a first plate having a first surface defining a first surface area and a thickness dimension in a direction transverse to the first surface;
    a second plate having a second surface defining a second surface area and a thickness dimension in a direction transverse to the second surface, wherein the second surface area is less than the first surface area and the thickness dimension of the second plate is less than the thickness dimension of the first plate; and
    a material capable of passing surface charge electrons coupled between and fixedly separating the first and second plates with the first surface of the first plate facing the second surface of the second plate, wherein the material allows a flow of surface charge electrons between the first plate and the second plate and restricts a flow of free electrons between the first plate and the second plate.

2. The electrical device of claim 1, wherein the material between the first and second plates is a porous dielectric.

3. The electrical device of claim 2, wherein the flow of surface charge electrons through the porous dielectric is essentially unrestricted.

4. The electrical device of claim 1, wherein the electrical device is encased in a dielectric enclosure.

5. The electrical device of claim 4, further comprising a transformer, wherein a primary side of the transformer is coupled to the first and second plates, and an output of the device is coupled to a secondary side of the transformer.

6. The electrical device of claim 5, further comprising a switch, wherein the switch is coupled between the first and second plates and the transformer.

7. The electrical device of claim 1, wherein the electrical device is encased in an enclosure which allows for an increase of a number of surface charge electrons within the dielectric enclosure.

8. The electrical device of claim 7, wherein the enclosure is coupled to a negative potential for increasing a number of surface charge electrons on the enclosure.

9. An electrical device as recited in claim 1, wherein the first plate is made of a first material and the second plate is made of a second material which is different from the first material.

10. An electrical device as recited in claim 1, wherein the first plate defines a first NEAF value and the second plate defines a second NEAF value which is different from the first NEAF value.

11. The electrical device of claim 10, wherein a difference between the first NEAF value and the second NEAF value is created by shaping the first plate and the second plate.

12. The electrical device of claim 5, wherein the shaping of the first plate and the second plate creates a concave first surface and a convex second surface.

13. The electrical device of claim 10, wherein a difference between the first NEAF value and the second NEAF value is created by the difference in thickness of the first plate and the second plate.

14. The electrical device of claim 10, wherein a difference between the first NEAF value and the second NEAF value is increased by adding heat to the first plate.

15. An electrical device is recited in claim 1, wherein the temperature of the first plate is approximately equal to the temperature of the second plate.

16. A method of making an electrical device for converting ambient heat into electrical energy, comprising the steps of:

providing a first plate having a first surface defining a first surface area and a thickness dimension in a direction transverse to the first surface;

providing a second plate having a second surface defining a second surface area and a thickness dimension in a direction transverse to the second surface, wherein the second surface area is less than the first surface area and the thickness dimension of the second plate is less than the thickness dimension of the first plate;

placing the first plate in a medium that passes surface charge electrons but does not pass free electrons; and placing the second plate into the medium in proximity to, but spaced from the first plate with the first surface of the first plate facing the second surface of the second plate.

17. A method as recited in claim 16, wherein the first plate is made of a first material and the second plate is made of a second material which is different from the first material.

18. A method as recited in claim 16, wherein the first plate defines a first NEAF value and the second plate defines NEAF value which is different from the first NEAF value.

19. An electrical device as recited in claim 16, wherein the temperature of the first plate is approximately equal to the temperature of the second plate.

20. A method of converting energy, comprising the steps of:

providing a first plate having a first surface defining a first surface area and a thickness dimension in a direction transverse to the first surface;

providing a second plate having a second surface defining a second surface area and a thickness dimension in a direction transverse to the second surface, wherein the second surface area is less than the first surface area and the thickness dimension of the second plate is less than the thickness dimension of the first plate;

placing the first plate in a medium; and placing the second plate into the medium, in proximity to the first plate with the first surface facing the second surface; and producing an electrical potential difference across the first and second plates.

21. A method as recited in claim 20, wherein said first and second plates are at substantially equal temperatures during said step of producing an electrical potential difference.

22. An electrical device, comprising:

a first plate having a first thickness and defining a first NEAF value, wherein the first plate is made of a first material;

a second plate having a second thickness and defining a second NEAF value, wherein the second plate is made of the first material, the second thickness is different from the first thickness and the second NEAF value is different from the first NEAF value; and a second material coupled between and fixedly separating the first and second plates, wherein the second material allows a flow of surface charge electrons between the first plate and the second plate and restricts a flow of free electrons between the first plate and the second plate.

* * * * *